US006182340B1

(12) United States Patent
Bishop

(10) Patent No.: US 6,182,340 B1
(45) Date of Patent: Feb. 6, 2001

(54) METHOD OF MANUFACTURING A CO-FIRED FLEXTENSIONAL PIEZOELECTRIC TRANSFORMER

(75) Inventor: Richard Patten Bishop, Fairfax Station, VA (US)

(73) Assignee: Face International Corp., Norfolk, VA (US)

( * ) Notice: Under 35 U.S.C. 154(b), the term of this patent shall be extended for 0 days.

(21) Appl. No.: 09/177,767

(22) Filed: Oct. 23, 1998

(51) Int. Cl.[7] .................................................. H01L 41/00
(52) U.S. Cl. ......................... 29/25.35; 310/318; 310/357
(58) Field of Search ......................... 29/25.35; 310/357, 310/359, 318

(56) References Cited

U.S. PATENT DOCUMENTS

| 3,084,228 | * | 4/1963 | Shiga .............................. 310/357 X |
| 3,401,377 | * | 9/1968 | Bartlett et al. ..................... 310/359 X |
| 4,087,716 | * | 5/1978 | Heywang ........................ 310/359 X |
| 5,959,391 | * | 9/1999 | Ogiso et al. ........................ 310/359 |

* cited by examiner

Primary Examiner—Carl E. Hall
(74) Attorney, Agent, or Firm—Stephen E. Clark; David J. Bolduc

(57) ABSTRACT

A method for manufacturing a cofired multi-layer piezoelectric transformer device includes forming first and second green shapes of a sinterable ceramic composition and applying metallization layer therebetween. Upon cofiring, the composite structure comprises first and second electroactive members bonded together by a conductive layer therebetween. External electrodes are applied and the electroactive members are polarized in a thickness direction, between their two major faces. The first and second electroactive members are arranged such that deformation of one electroactive member results in corresponding deformation of the other electroactive member. The device provides substantial transformation ratios in which relatively high power may be transferred in relation to the size of the unit, operability over wide input and output frequency bandwidths, and electrical isolation of the input voltage and current from the output voltage and current.

8 Claims, 5 Drawing Sheets

METHOD OF MANUFACTURING A CO-FIRED FLEXTENSIONAL PIEZOELECTRIC TRANSFORMER

BACKGROUND OF THE INVENTION

1. Field of Invention

The present invention generally relates to flextensional piezoelectric transformers and actuators, and more particularly, to a method of manufacturing a flextensional multi-layer piezoelectric transformer/actuator by cofiring the ceramic composition with the electrode forming metallization.

2. Description of the Prior Art

Wound-type electromagnetic transformers have been used for generating high voltage in internal power circuits of devices such as televisions or in charging devices of copier machines which require high voltage. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce.

To remedy this problem, piezoelectric transformers utilizing the piezoelectric effect have been provided in the prior art. In contrast to the general electromagnetic transformer, the piezoelectric ceramic transformer has a number of advantages. The size of a piezoelectric transformer can be made smaller than electromagnetic transformers of comparable transformation ratio. Piezoelectric transformers can be made nonflammable, and they produce no electromagnetically induced noise.

Materials exhibiting piezoelectric and electrostrictive properties develop a polarized electric field when placed under stress or strain. Conversely, they undergo dimensional changes in an applied electric field. The dimensional change (i.e., expansion or contraction) of a piezoelectric or electrostrictive material is a function of the applied electric field.

The ceramic bodies employed in prior piezoelectric transformers take various forms and configurations, including rings, flat slabs and the like. A typical example of a prior piezoelectric transformer is illustrated in FIG. 1. This type of piezoelectric transformer is commonly referred to as a "Rosen-type" piezoelectric transformer. The basic Rosen-type piezoelectric transformer was disclosed in U.S. Pat. No. 2,830,274 to Rosen, and numerous variations of this basic apparatus are well known in the prior art. The typical Rosen-type piezoelectric transformer comprises a flat ceramic slab 10 which is appreciably longer than it is wide and substantially wider than thick. As shown in FIG. 1, a piezoelectric body 10 is employed having some portions polarized differently from others. In the case of FIG. 1, the piezoelectric body 10 is in the form of a flat slab which is considerably wider than it is thick, and having greater length than width. A substantial portion of the slab 10, the portion 12 to the right of the center of the slab is polarized longitudinally, whereas the remainder of the slab is polarized transversely to the plane of the face of the slab. In this case the remainder of the slab is actually divided into two portions, one portion 14 being polarized transversely in one direction, and the remainder of the left half of the slab, the portion 16 also being polarized transversely but in the direction opposite to the direction of polarization in the portion 14.

In order that electrical voltages may be related to mechanical stress in the slab 10, electrodes are provided. If desired, there may be a common electrode 18, shown as grounded. For the primary connection and for relating voltage at opposite faces of the transversely polarized portion 14 of the slab 10, there is an electrode 20 opposite the common electrode 18. For relating voltages to stress generated in the longitudinal direction of the slab 10, there is a secondary or high-voltage electrode 22 cooperating with the common electrode 18. The electrode 22 is shown as connected to a terminal 24 of an output load 26 grounded at its opposite end.

In the arrangement illustrated in FIG. 1, a voltage applied between the electrodes 18 and 20 is stepped up to a high voltage between the electrodes 18 and 22 for supplying the load 26 at a much higher voltage than that applied between the electrodes 18 and 20.

A problem with prior piezoelectric transformers is that they are difficult to manufacture because individual ceramic elements must be "poled" at least twice each, and the direction of the poles must be different from each other.

Another problem with prior piezoelectric transformers is that they are difficult to manufacture because it is necessary to apply electrodes not only to the major faces of the ceramic element, but also to at least one of the minor faces of the ceramic element.

Another problem with prior piezoelectric transformers is that they are difficult to manufacture because, in order to electrically connect the transformer to an electric circuit, it is necessary to attach (i.e. by soldering or otherwise) electrical conductors (e.g. wires) to electrodes on the major faces of the ceramic element as well as on at least one minor face of the ceramic element.

Another problem with prior piezoelectric transformers is that the voltage output of the device is limited by the ability of the ceramic element to undergo deformation without cracking or structurally failing. It is therefore desirable to provide a piezoelectric transformer which is adapted to deform under high voltage conditions without damaging the ceramic element of the device.

Piezoelectric and electrostrictive devices (generally called "electroactive" devices herein) are also commonly used as drivers, or "actuators," due to their propensity to deform under applied electric fields. When used as an actuator, it is frequently desirable that the electroactive device be constructed so as to generate relatively large deformations and/or forces from the electrical input. Prior electroactive devices include flextensional transducers which are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. By coupling two or more electroactive devices, the deformation of one "actuator" can cause the deformation of the adjacent coupled actuator.

Another type of transformer, which is disclosed in co-pending patent application Ser. No. 08/864,029 takes advantage of both the electrical properties of electroactive devices as well as the mechanical "actuator" properties. As disclosed in my copending patent application, a piezoelectric transformer can be made by mechanically bonding electroactive devices to each other such that an input voltage is transformed into mechanical movement, which is translated through the mechanical bond to the adjacent electroactive device, which generates an output voltage.

One embodiment of the type of piezoelectric transformer disclosed in my co-pending patent application is illustrated in FIG. 2. This transformer 1 is manufactured by stacking two ceramic wafers 30 and 48 between three preferably metallic layers 36, 42 and 54, bonding them together with four adhesive layers 34, 40, 44 and 52, and simultaneously heating the stack to a temperature above the melting point of the adhesive materials, such as LaRC-SI™ developed by NASA Langley Research Center. The adhesive used is a very strong adhesive and has a coefficient of thermal contraction which is greater than that of most ceramics (and, in particular, is greater than that of the materials of the two ceramic wafers 30 and 48). The adhesive is used to apply a bond between the respective metallic layers 36, 42 and 54 and the ceramic wafers 30 and 46 and the bond is sufficient to transfer longitudinal stresses between adjacent layers of the transformer 1.

After the entire stack of laminate layers have been heated to a temperature above the melting point of the adhesive materials, the entire stack of laminate layers is then permitted to cool to ambient temperature. As the temperature of the laminate layers falls below the melting temperature of the adhesive materials, the four adhesive layers 34, 40, 44 and 52 solidify, bonding them to the adjacent metallic layers 36, 42 and 54. During the cooling process the ceramic wafers 30 and 42 become compressively stressed along their longitudinal axes due to the relatively higher coefficients of thermal contraction of the materials of construction of the metallic layers 36, 42 and 54. By compressive stressing the two ceramic members 30 and 42, the ceramic members 30 and 42 are less susceptible to damage (i.e. cracking and breaking).

A piezoelectric transformer constructed in accordance with the preceding description comprises a pair of piezoelectric ceramic wafers 30, and 42 which are intimately bonded to each other (albeit separated by laminated adhesive 34, 40, 44 and 52 and metallic layers 36, 42 and 54) along one of each of their major faces. The metallic layers 36, 42 and 54 and the four adhesive layers 34, 40, 44 and 52 are longer than the two ceramic wafers 30 and 42 and, accordingly, protrude beyond the ends of the ceramic members 30 and 42. Electric terminals 56, 58 and 60 are connected (e.g. by wire and solder, or other common means) to an exposed surface of the metallic layers 36, 42 and 54 respectively.

Referring again to FIG. 2: When a primary (i.e. input) voltage V1 is applied across terminals 58 and 60 connected to the electrodes 32 and 38 of the first ceramic wafer 30, the first ceramic wafer 30 will piezoelectrically generate an extensional stress commensurate with the magnitude of the input voltage V1, the piezoelectric properties of the wafer 30 material, the size and geometry of the wafer 30 material, and the elasticity of the other materials of the other laminate layers (i.e. the ceramic wafer 48, the three pre-stress layers 36, 42 and 54, and the four adhesive layers 34, 40, 44 and 52) which are bonded to the first wafer 30. The extensional stress which is generated by the input voltage Vi causes the first ceramic wafer 30 to be longitudinally strained, (for example as indicated by arrow 64).

Because the first ceramic wafer 30 is securely bonded to the second ceramic wafer 48 (i.e. by adhesive layers 40 and 44), any longitudinal strain 64 of the first ceramic wafer 30 will result in a longitudinal strain (of the same magnitude and direction) in the second ceramic wafer 48 (as indicated by arrow 65). The longitudinal strain 65 of the second piezoelectric ceramic wafer 48 generates a voltage potential V2 across the two electroplated surfaces 46 and 50 of the second ceramic wafer 48. The electric terminals 58 and 56 may be electrically connected to corresponding electroplated surfaces 46 and 50 of the second ceramic wafer 48. The magnitude of the piezoelectrically generated voltage V2 between the two electrodes 46 and 50 of the second ceramic wafer 48 depends upon the piezoelectric properties of the wafer 48 material, the size, geometry and poling of the wafer 48 material.

Thus, by applying a first voltage V1 across the electroplated 32 and 38 major surfaces of the first ceramic wafer 30, the first ceramic wafer 30 is caused to longitudinally strain 64, which, in turn, causes the second ceramic wafer 48 to longitudinally strain 65 a like amount, which, in turn produces a second voltage potential V2 between the electroplated 46 and 50 major surfaces of the second ceramic wafer 48.

The ratio of the first voltage V1 to the second voltage V2 is a function of the piezoelectric properties of the wafer 30s and 48, the size and geometry of the wafers 30 and 48 material, the elasticity of the other materials of the other laminate layers (i.e. the ceramic wafers 30 and 48, the three pre-stress layers 36, 42 and 54, and the four adhesive layers 34, 40, 44 and 52), and the poling characteristics of the two ceramic wafers 30 and 48.

In the one embodiment of the invention disclosed in my co-pending patent application, the facing electroplated surfaces 38 and 46 of the first ceramic wafer 30 and second ceramic wafer 48, respectively, are electrically connected to a common electric terminal 58. In alternative embodiments of the transformer (not shown) the corresponding facing electroplated surfaces 38 and 46 of two ceramic wafers 30 and 48 are electrically insulated from each other, (for example by a dielectric adhesive layer), and connected to corresponding terminals. In this modified embodiment of the transformer the two piezoelectric ceramic wafers 30 and 48 are completely electrically isolated from each other. A transformer constructed in accordance with this modification of the invention may be used in an electric circuit to electrically protect electrical components "downstream" from the transformer from damage from high current discontinuities "upstream" of the transformer.

Although, this type of piezoelectric transformer is simpler to manufacture than prior art Rosen transformers, it is still somewhat difficult to manufacture because the necessity of adhering electrodes between the ceramic wafers and to the major faces of the ceramic wafers.

Another problem with such methods of manufacturing piezoelectric transformers is that it is difficult to maintain complete electrical contact over the entire major face of the ceramic wafer, because of the presence of multiple adhesive layers between the ceramic and metallic layers.

Another problem with piezoelectric transformers manufactured by such a process is that the adhesive bond between the metallic layer and ceramic layer may not be uniform, and the adhesive may delaminate or detach due to deformation of the ceramic layer.

Another problem is that the presence of multiple adhesive layers between the metallic and ceramic layers makes miniaturization of piezoelectric transformers more difficult using such methods of manufacturing.

Another problem with piezoelectric transformers manufactured by such a process is that the multiple adhesive and metallic layers between ceramic layers dampen the motion of the first ceramic layer and limit the translation of motion from the first ceramic layer to the adjacent ceramic layer.

SUMMARY OF THE INVENTION

The term piezoelectric transformer is here applied to an electrical energy-transfer device employing the piezoelectric properties of co-joined materials to achieve the transformation of voltage or current or impedance. It is an object of the invention to provide a piezoelectric transformer which, in a preferred embodiment is not only capable of substantial transformation ratios, but in which relatively high power may be transferred in relation to the size of the unit.

Accordingly, it is a primary object of the present invention to provide a piezoelectric transformer which may be easily and inexpensively produced.

It is another object of the present invention to provide a device of the character described which is capable of producing high voltages and which may safely be used in high voltage circuits.

It is another object of the present invention to provide a piezoelectric transformer of the character described comprising a pair of ceramic elements, each exhibiting piezoelectric properties, which are in physical (mechanical) communication with each other such that deformation of one ceramic element results in corresponding deformation of the other ceramic element.

It is another object of the present invention to provide a piezoelectric transformer of the character described which is easy to manufacture because it is sufficient to pole each ceramic element only once, and wherein the direction of poling for each ceramic element is constant over its entire mass.

It is another object of the present invention to provide a piezoelectric transformer of the character described which is easy to manufacture because it is sufficient have electrodes only on the major faces of the ceramic elements, and which do not require application of electrodes to minor faces of the ceramic elements.

It is another object of the present invention to provide a piezoelectric transformer of the character described which is easy to manufacture because it is sufficient to apply electrodes only to two parallel faces of the ceramic elements.

It is another object of the present invention to provide a piezoelectric transformer of the character described which is easy to connect or install in an electric circuit, because it is sufficient to attach (i.e. by soldering or otherwise) electrical conductors (e.g. wires) only to electrodes on the major faces of the ceramic element.

It is another object of the present invention to provide a piezoelectric transformer of the character described which is adapted to deform under high voltage conditions without damaging the ceramic element of the device.

It is another object of the present invention to provide a piezoelectric transformer of the character described which is operable over wide input and output frequency bandwidths.

It is another object of the present invention to provide a piezoelectric transformer of the character described which electrically isolates the voltage and current at the input to the device from the voltage and current at the output of the device.

It is another object of the present invention to provide a piezoelectric transformer of the character described in which the translation of motion from one ceramic layer to another ceramic layer is not dampened by an interposed adhesive layer.

It is another object of the present invention to provide a piezoelectric transformer of the character described in which the translation of motion from one ceramic layer to another ceramic layer is not substantially dampened by an interposed metallic layer.

It is another object of the present invention to provide a piezoelectric transformer of the character described which may be constructed without the use of adhesives.

It is another object of the present invention to provide a piezoelectric transformer of the character described in which the metallization adheres well to adjacent ceramic layers.

It is another object of the present invention to provide a piezoelectric transformer of the character described in which the metallization has similar mechanical characteristics to the adjacent ceramic layers.

It is another object of the present invention to provide a piezoelectric transformer of the character described in which the metallization has thermal expansion characteristics similar to a ceramic.

It is another object of the present invention to provide a piezoelectric transformer of the character described in which the metallization has desirable electrical characteristics for use in a piezoelectric transformer.

It is another object of the present invention to provide a piezoelectric transformer of the character described in which the metallization is less expensive than conventional metallization (electrode) materials used in piezoelectric transformers.

It is another object of the present invention to provide a piezoelectric transformer of the character described in which the formation of piezoelectric ceramic layers occurs simultaneously with the bonding of electrodes (metallization) to the ceramic layer.

It is another object of the present invention to provide a piezoelectric transformer of the character described in which the metallization has desirable thermal and oxidation characteristics for use in a cofired piezoelectric transformer.

Further objects and advantages of the invention will become apparent from a consideration of the drawings and ensuing description thereof.

DESCRIPTION OF THE PREFERRED EMBODIMENTS

Figure 1:
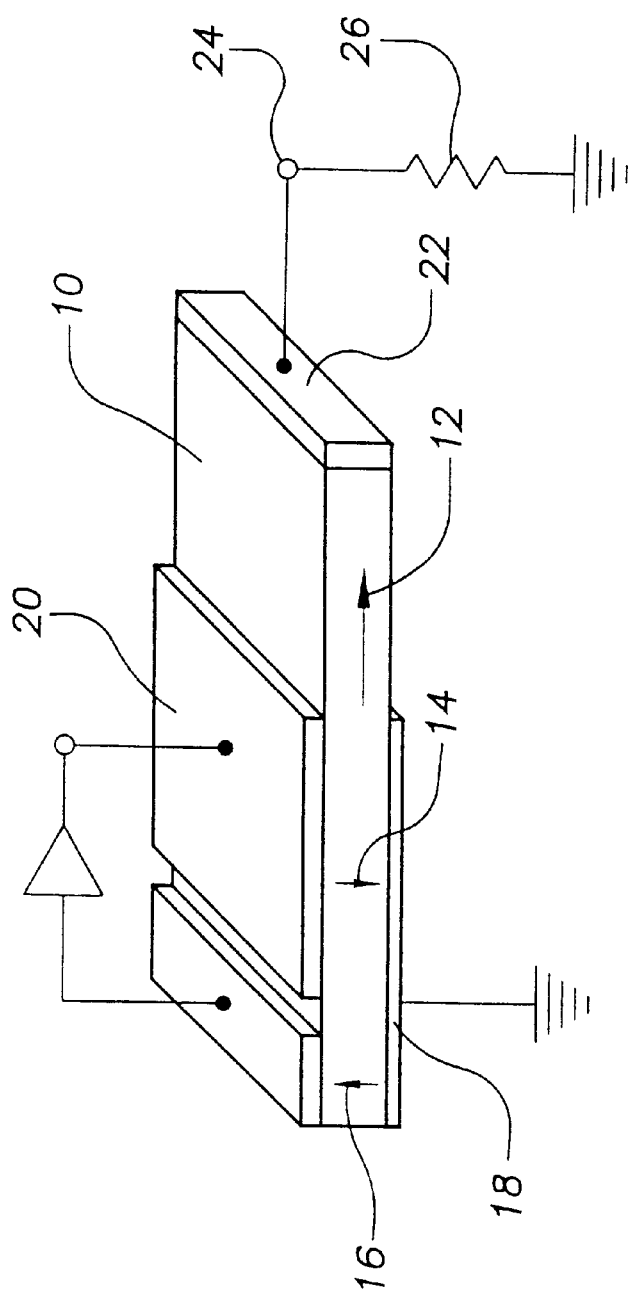
FIG. 1 is a perspective view showing the construction of a Rosen-type piezoelectric transformer of the prior art.
Figure 2:
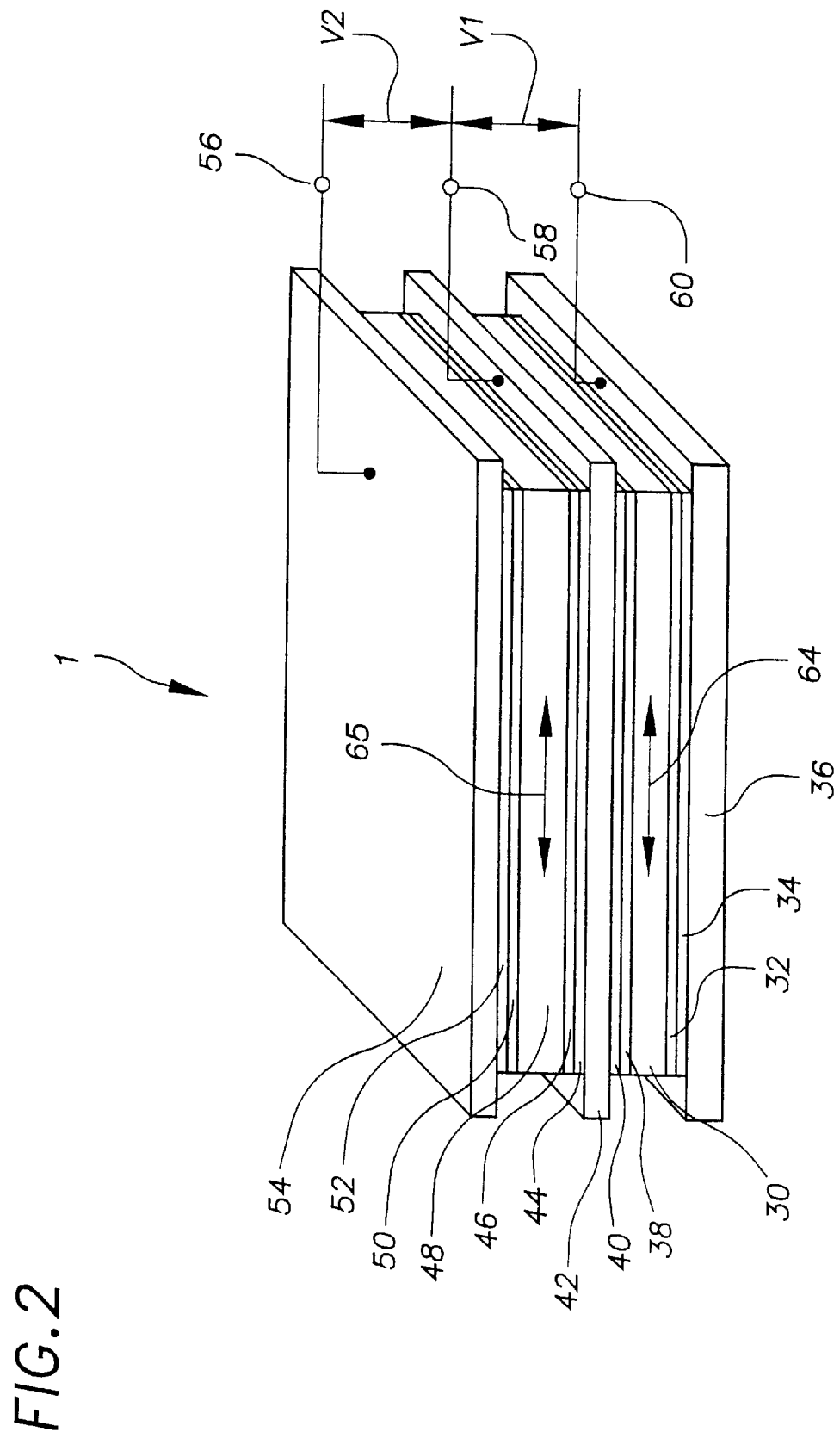
FIG. 2 is a perspective view showing the construction of a piezoelectric transformer using adhesives for bonding adjacent laminate layers.

With reference directed toward the appended drawings, a piezoelectric transformer/actuator (generally designated by the reference numeral 2) manufactured embodying the principles and concepts of the present invention will be described.

As will be described more fully herein below, a piezoelectric transformer/actuator 2 is manufactured, in part, by first mixing a ceramic powder with a binder (step 100); forming green ceramic shapes (step 102); applying electrode materials (steps 104 and 114); and cofiring the composite structure (steps 106, 108, 110 and 112).

Figure 3:
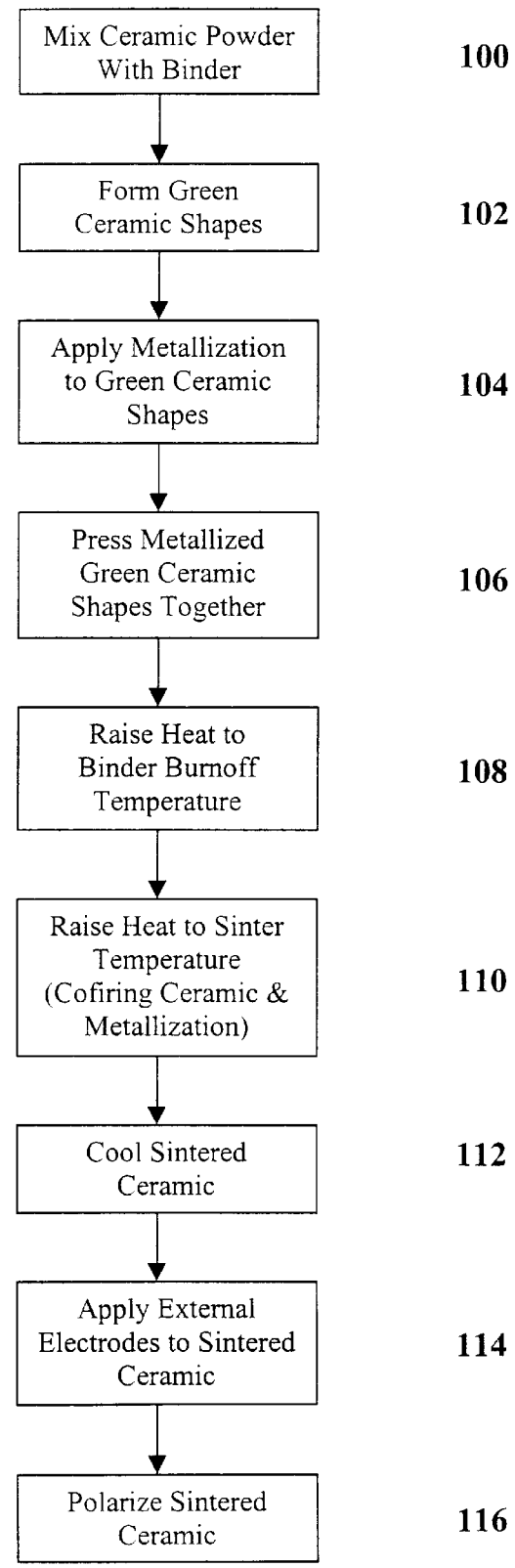
FIG. 3 is a flow diagram showing the steps of the cofiring process for producing a piezoelectric transformer in accordance with the preferred embodiment of the present invention.

Referring to FIG. 3: FIG. 3 is a flow diagram showing the steps in the preferred embodiment of the present invention, with individual steps denoted by three-digit reference indicia. The first step in the preferred embodiment of the present invention is to mix 100 a ceramic powder with an appropriate amount of a binder. This mixture of a powder and binder forms a sinterable ceramic composition which can produce an electrical ceramic upon firing the mixture.

A variety of electrical ceramic materials exist, such as might be or are used in electroactive devices (for example, lead titanate, PbTiO3; lead zirconate titanate, "PZT"; lanthanum doped PZT, "PLZT"; barium titanate, BaTiO3; lithium niobate, LiNbO3; bismuth titanate, Bi4Ti3O12; Aluminum Nitride, AlN; and yttrium barium copper oxide, YBa2Cu3O7. Other electrical ceramics include piezoelectric crystals which are grown, such as lithium gallium oxide, β-LiGaO2; lithium aluminum oxide, LiA1O2; lithium tantalate; LiTaO3; and calcium pyroniobate, Ca2Nb2O7. Other electrical ceramics include those which are based on the above listed ceramics doped with small amounts of other materials to alter their electrical and/or mechanical properties Production of sinterable ceramic compositions is known in the art. For example, lead zirconate titanate (PZT) is an often used ceramic for piezoelectric applications. Optimum material properties are obtained in the production of PZT when the titanium/zirconium ratio is exactly matched at least in the range of a few thousandths, with respect to the morphotropic phase boundary, when the titanium and zirconium atoms in the ceramic are uniformly distributed over the grains, as well as in the individual grains, and when the sintering temperature for the piezoceramic is as low as possible. The latter condition achieves stable and reproducible conditions by minimizing the evaporation of the lead oxide content from the ceramic during the sintering. These demands can only be met when extremely fine, chemically uniform and pure-phase PZT powders having a suitable stoichiometry are used for shaping the green compacts, which can subsequently be sintered at low temperature.

Numerous methods are known for producing PZT powders having the required properties. For example, powders can be produced chemically by co-precipitation, spraying reaction or sol-gel processes. These powders already contain all cations including lead. An optimally low sintering temperature is usually achieved by controlling the fineness of the particles.

A mixed oxide method is often used for practically producing a piezoceramic in commercial quantities. In this method, a mixture of lead oxide (PbO) dopant oxides, titanium dioxide (TiO2) and especially finely particulate zirconium oxide (ZrO2) is ground, dried and, typically, convened (calcined) into PZT powder at approximately 900 deg. C. Due to the different reaction behavior of TiO2 and ZrO2 with PbO, however, PZT powder particles arise having a Ti/Zr ratio from PbTiO3 (No zirconium) through PbZrO3 (No titanium) which is significantly scattered around a desired value. The powder must therefore be ground and mixed a second time. The homogeneity of the titanium/zirconium ratio which can be achieved by diffusion and grain growth in the sintering of this known powder during compression is limited by the sintering temperature, by particle size, as well as by the heterogeneity of the powder. The optimum piezoelectric material values of the sintered ceramic, or the optimum composition of the sintered ceramic with respect to the morphotropic phase boundary, are empirically set for each process on site, and may be possibly re-adjusted by a fine variation of the oxide mixture with respect to the Ti/Zr ratio. A reproducible production of PZT piezoceramics is thus possible by means of above mentioned processes.

Referring again to FIG. 3, in the first steps of the preferred embodiment of the present invention, a ceramic powder is combined 100 with an organic binder and pressed 102 into "green" shapes. The organic binding material used in the present process bonds the particles of ceramic powder together and enables formation of the required shape with desired solids content (i.e., ratio of ceramic powder to binding material). The organic binding material pyrolyzes, i.e. thermally decomposes, at an elevated temperature ranging generally from about 50 deg. C to below about 800 deg. C, and preferably from about 100 deg. C to about 500 deg. C. In non-oxidizing atmospheres, the binding material decomposes to elemental carbon and gaseous product of decomposition which vaporizes away. In an oxidizing atmosphere, the binding material decomposes to a gaseous oxidized product which vaporizes away.

The organic binding material is a thermoplastic material with a composition which can vary widely and which is well known in the art. Besides an organic polymeric binder it can include an organic plasticizer to impart flexibility to a green shape. The amount of plasticizer can vary widely depending largely on the particular binder used and the flexibility desired, but typically, it ranges up to about 50% by weight of the total organic content. The organic binding material may also be soluble in a volatile solvent.

Representative of useful organic binders are polyvinyl acetates, polyamides, polyvinyl acrylates, polymethacrylates, polyvinyl alcohols, polyvinyl butyrals, and polystyrenes. Representative of useful plasticizers are dioctyl phthalate, dibutyl phthalate, polyethylene glycol and glycerol trioleate. ordinarily, the organic binder has a molecular weight at least sufficient to make it retain its shape at room temperature and generally such a molecular weight ranges from about 20,000 to about 80,000.

The particular amount of organic binding material used in forming the mixture is determinable empirically and depends largely on the amount and distribution of solids desired in the resulting green shape. Generally, the organic binding material ranges from about 10% by volume to about 50% by volume of the solids content of the mixture in the green shape, and preferably constitutes about 15% to 25% by volume of the sinterable ceramic composition.

An oxidizing agent may be used when the green shape is to be sintered in a non-oxidizing atmosphere. The oxidizing agent should be used at least in an amount sufficient to react with the total amount of elemental carbon produced by pyrolysis of the organic binding material. For example, the actual amount of elemental carbon introduced by pyrolysis of the organic binding material can be determined by pyrolyzing the organic material alone under the same conditions used in the present cofiring and determining weight loss. Generally, the oxidizing agent ranges from about 0.5% by weight to about 5% by weight, and frequently from about 1% by weight to about 3% by weight, of the sinterable ceramic composition.

In carrying out the present process, the sinterable ceramic composition and organic binding material are admixed 100 to form a uniform or at least a substantially uniform mixture or suspension which is formed 102 into a sheet or other shape of desired thickness and solids content. A number of conventional techniques can be used to form the mixture 100 and resulting green shape 102. Generally, the components are milled in an organic solvent in which the organic material is soluble or at least partially soluble to produce a castable mixture or suspension. Examples of suitable solvents are methyl ethyl ketone, toluene and alcohol. The mixture or suspension is then formed 102 into a sheet of desired thickness in a conventional manner, such as by doctor blading, or cast 102 into a desired shape by injection molding, extrusion, or pressing, and preferably hot pressing. The cast shape is then dried to evaporate the solvent therefrom to produce 102 the final green shape.

The particle size of the solids content of the mixture or suspension can vary widely depending largely on the particular substrate to be formed and is determinable empirically. The thickness of the present green shape can vary widely depending largely on its particular application. Generally, however, its thickness ranges from about 0.1 mm to about 10 mm. Preferably, the present green shape is of uniform or at least of substantially uniform thickness from about 1 mm to 6 mm.

In the present invention the green shape which is formed 102, consists preferably of disk shaped wafers. Preferably two wafers are formed 102, each wafer having two major opposing faces. The diameter of the wafer is generally greater than the thickness of the wafer and is generally at least four times the wafer's thickness. The wafers may be of equal or unequal thickness, depending on the final properties desired from the piezoelectric transformer. The wafers may be of unequal or preferably equal diameter. The wafers may also be made of dissimilar or preferably the same type of electrical ceramic materials. The green shape may also be of other shapes than disk-like wafers, such as in the shape of rectangular slabs.

The next step is to apply 104 metallization material to the green shapes. Metallization should be applied 104 to a major face of a green shape, and preferably to one face of each wafer. Metallization material is a metallization-forming material, i.e. during cofiring it forms the electrically conductive metal phase on the ceramic wafer. Generally, the metallization material is in the form of a paste or ink of the metal particles suspended in organic binder and solvent. Frequently, the metallization material also contains some glass frit or it may be mixed with some of the powder which formed the ceramic wafer. The glass or ceramic powder aid in the adherence of the metal to the ceramic wafer. Generally, the metal particles range in size from about 0.1 micron to about 20 microns and preferably from 2 to 5 microns.

The metallization material is a metal whose particles can be sintered together to produce a continuous electrically conductive phase during sintering 110 of the sinterable ceramic composition. Desirable metallization materials are materials that exhibit compatible thermal and mechanical properties with the electroactive ceramic. In particular, it is desirable to have a metallization material whose coefficient of linear expansion is close to that of the final sintered ceramic. Metallization that has a coefficient of linear expansion comparable to the final sintered ceramic is less likely to fracture or delaminate from the bonded ceramic.

Furthermore, the metal must be solid during sintering 110 to prevent migration of the metallization material into the ceramic during sintering 110. Therefore, it is desirable that the metallization material have a high melting point, specifically, a melting point higher than the highest sintering temperature (usually around 1300 deg. C) of the ceramic. Metals which have lower melting points, such as aluminum (660 deg. C) and silver (962 deg. C), are thus not appropriate as metallization materials for electrical ceramics that require sintering temperatures above their melting points.

The properties of electroactive ceramics are typically optimized by heat treatments (sintering) at high temperatures (for example, 500 deg. C to 1300 deg. C). Many electrical ceramics, such as ceramic oxides require sintering in an oxidizing atmosphere. Many materials commonly used as electrodes are not suitable for use under high temperature and oxidizing conditions. The electrode material also should not deleteriously react with the ceramic substrate or the sintering atmosphere. As examples, aluminum electrodes would melt or react with the electrical ceramic oxide material; and silicides and polysilicon either react with the electrical ceramic at the higher temperatures or are oxidized at the surface in contact with the electrical ceramic oxide.

Moreover, if the oxide of an electrode metal has a high resistivity, reaction of the metallization material with the electrical ceramic oxide will create an interfacial dielectric layer of oxidized electrode material between the electrode and the electrical ceramic oxide. This may give rise to a capacitor in series with the electrical ceramic oxide, reducing the voltage drop experienced across the electrical ceramic oxide. Thus it is desirable that the metallization material not lose its conductivity due to reaction with oxygen or other ambients in the atmosphere or in the abutting ceramic layers. In the application of electroceramics as transformers, efficiency and the power factor are reduced as a result this loss.

Noble metals (e.g. platinum, palladium, and gold) may be used as electrode materials for multilayer piezoelectric devices. These noble metals have high melting points and are resistant to oxidation which helps to eliminate the problems associated with interfacial dielectric layers composed of the oxides of the electrode materials. Thus noble metals may be used as metallization for both oxide and non-oxide electroceramics.

Some other metals that are conductive are the platinum group metals (PGMs include Ruthenium, Rhodium, Iridium and Osmium). PGMs also form oxides that are conductive. Other conductive oxides of metals are Indium oxide and indium-tin oxide. These metals may be used as electrode materials for multilayer piezoelectric devices because they have high melting points, and because their oxides are conductive, they are resistant to the problems associated with interfacial dielectric layers composed of the oxides of the electrode materials. Thus, PGMs and their oxides may be used as conductors for both oxide and non-oxide electroceramics.

Some other metals readily oxidize in air at higher temperatures, forming nonconductive layers and thus are not suited to use as electrodes in oxide-containing electroceramics cofired in air. Among the metals that readily oxidize in air are zinc, copper and aluminum and particularly refractory metals (i.e., Tungsten @ 190 deg. C., Molybdenum @ 395 deg. C., Tantalum/Columbium @ 425 C.). Thus these metals are not appropriate as conductors for piezoelectric transformers cofired in an oxidizing atmosphere. These refractory metals however are desirable from the standpoint that they have good conductivity, high melting points, and a coefficient of linear expansion similar to that of final sintered electroceramics. The refractory metals may be used where the sintering atmosphere is slightly oxidizing with respect to the organic binder, but not oxidizing with respect to the metallization material, such as a hydrogen atmosphere with a high water vapor content.

The oxides of these metals may be appropriate in an alternate embodiment of the invention as intermediate dielectric layers located between the conductive layers in an oxide ceramic transformer. The refractory metals remain good conductors for non-oxide electrical ceramics, and in particular, the refractory metals have the advantages of having a high melting point and a coefficient of linear expansion similar to electroceramics.

The metallization material can be contacted 104 with the green shapes by a number of conventional techniques. These methods include Chemical Vapor Deposition (CVD), sputtering, and printing. Generally, the metallization is deposited or printed onto the electroceramic, and preferably it is screen printed thereon.

The shapes are then stacked 106 together, i.e. superimposed on each other, generally forming a sandwich. The stack can be laminated under a pressure and temperature determinable largely by its particular composition, but usually lower than about 100 deg. C., to form a laminated composite structure which is then cofired 108 and 110. The term cofiring encompasses the application of heat 108 and 110 to the composite structure in a two part process. In the first part of the process, the temperature of the composite structure is raised 108 in order to cause the organic binder to burn off. In the second part of the cofiring process the temperature is again raised 110 in order to sinter the metallization and the ceramic. The final cofired structure is a sintered structure comprised of a sintered ceramic substrate and an adherent electrically conductive phase of metal or metal oxide between the ceramic layers.

The present cofiring process is carried out in an atmosphere in which the ceramic substrate and metal are inert or substantially inert, i.e. an atmosphere or vacuum which has no significant deleterious effect thereon. Specifically, for non-oxide ceramics, the atmosphere or vacuum should be nonoxidizing with respect to the metallization and the ceramic substrate. Representative of a useful atmosphere is dissociated ammonia, nitrogen, hydrogen, a noble gas and mixtures thereof. Preferably, a reducing atmosphere containing at least about 1% by volume of hydrogen, and more preferably at least about 5% by volume of hydrogen, is used to insure maintenance of sufficiently low oxygen partial pressure. Preferably, the atmosphere is at ambient pressure.

For oxide containing electroceramics, the sintering atmosphere is non-reducing, and is preferably air. However, where the metallization material oxidizes at higher temperatures, a slightly oxidizing atmosphere of up to 20 percent hydrogen in nitrogen with water vapor may be used (hydrogen to water ratio should be around 2.5). Preferably, the atmosphere is at ambient pressure.

Generally, during binder burn off 108, in the firing temperature range up to about 500deg. C., a slower heating rate is desirable because of the larger amount of gas generated at these temperatures by the decomposition of the organic binding material. Typically, the heating rate for a sample of less than about 6 mm thickness can range from about 1 deg. C. per minute to about 8 deg. C. per minute up to 500 deg. C.

For non-oxide electrical ceramics, at a cofiring temperature of less than about 800 deg. C., the pyrolysis of the organic material is completed leaving a residue of elemental carbon. Generally, the amount of elemental carbon produced by pyrolysis is at least about 0.05% by volume, and usually at least about 0.4% by volume, of the substrate. When the cofiring temperature is increased 108 to a range of from about 800 deg. C. to about 1200 deg. C., but below the temperature at which closed porosity is initiated in the non-oxide ceramic substrate, the oxidizing agent reacts with the elemental carbon producing carbonaceous gases which vaporize away through the open porosity of the substrate thereby removing the elemental carbon from the substrate.

After the binder has burnt off 108, the cofiring temperature is then increased 110 to the sintering temperature. The sintering temperature is that temperature at which the ceramic substrate densifies to produce a ceramic substrate having a decreased porosity. In the present cofiring, the rate of heating is determinable empirically and depends largely on the thickness of the sample and on furnace characteristics. After binder burnoff 108, the rate at which the cofiring temperature is increased is about 200 deg. C. per hour.

The sintering temperature can vary widely depending largely on the particular ceramic composition, but generally it is above 800 deg. C. and usually ranges from about 900 deg. C. to about 1300 deg. C. For example, when firing PZT, upon reaching a sintering temperature from about 1240 deg. C. to 1300 deg. C., that temperature should be maintained for 1 to 8 hours. Below this temperature optimum density will not be achieved and above this temperature lead loss may become excessive and some melting may occur. The final porosity should be less than about 10% by volume, preferably less than about 5% by volume, and more preferably, less than about 1% by volume of the substrate.

During sintering 110, the ceramic composition is liquid-phase sintered producing a ceramic substrate of desired density, and the metal particles are sintered together producing a continuous electrically conductive phase. During sintering 110, a portion of the liquid phase which enables sintering of the ceramic migrates into the interstices between the sintering metal particles by capillarity resulting in a phase, usually a glassy phase, intermingled with the continuous phase of metal which aids in the adherence of the metal phase to the ceramic layers.

In order to produce a sufficiently densified ceramic, the composite structure must be sintered 110 in an appropriate atmosphere in order to enhance densification. For oxide based electrical ceramics, such as PZT, the sintering atmosphere should be substantially pure oxygen, although a positive oxygen pressure is unnecessary. A convenient way to achieve this atmosphere is to introduce pure oxygen into the open end of a tube furnace at a flow rate of about 150 cubic centimeters per minute. Sintering 110 should be carried out from 1240 deg. C. to 1300 deg. C. for 1 to 8 hours, below which optimum density will not be achieved and above which lead loss may become excessive and some melting may occur. It is preferred to sinter 110 at a temperature from 1280 deg. C. to 1300 deg. C. for 2 to 4 hours in order to achieve optimum density.

During sintering 110, precautions should be exercised to avoid excessive lead loss by volatilization as such lead loss may be significant in shifting the composition outside the range in which optimum piezoelectric properties have been observed. For example, covering the pressed part with powder of the same composition, adding a compensatory excess of lead to the starting composition, carrying out sintering 110 in a sealed container, or a combination of one or more of these steps are appropriate precautions.

Upon completion of the cofiring 110, the resulting structure is allowed to cool 112, preferably to ambient temperature. The rate of cooling 112 can vary, but it should have no significant deleterious effect on the structure, i.e., should not cause thermal shock or cracking. Preferably, it is furnace cooled 112 to ambient temperature. The final ceramic should have a porosity of less than about 10% by volume, preferably less than about 5% by volume, more preferably less than 1% by volume, and most preferably, pore-free, i.e., fully dense.

Upon completion of the cofiring 110, and more preferably upon completion of cooling 112 the sintered ceramic, exterior electrodes 76 and 78 may be applied 114. The exterior electrodes 76 and 78 are deposited on the exterior faces of the ceramic wafers 70 and 72. Because these exterior electrodes 76 and 78 do not undergo the cofiring process 108 and 110, they are not required to withstand oxidation at high temperatures. Thus these electrodes 76 and 78 may be made of any conventional electrode material such as aluminum or silver. These exterior electrodes 76 and 78 may be applied 114 by any conventional means such as by sputtering, CVD, thin foil adhesion, or preferably by electroplating the exterior faces of the sintered ceramic. Optionally, the electrode materials 76 and 78 may be deposited 104 on both faces of the green ceramic and cofired 108 and 110 with the green shape to produce both the interior 74 and exterior electrodes 76 and 78.

Upon completion of applying 114 the external electrodes, the sintered ceramic is then polarized 116, preferably in the thickness direction (i.e. normal to the major faces transformer). Polarization should occur simultaneously to both ceramic layers 70 and 72 rather than one at a time, because dimensional shrinkage of a ceramic layer 70 due to the polarizing electric field may delaminate one ceramic layer 70 from the other ceramic layer 72. Polarizing 116 may be accomplished by placing the sintered ceramic on a grounded, metallic, surface and contacting it with an electrically charged metal brush (not shown). Polarization 116 of the device should occur with the device submerged in oil, such as peanut oil or silicone oil, to prevent arcing across the electrodes under a high intensity electric field. The temperature of the ceramic should also come into equilibrium with the temperature of the oil (about 80 deg. C to 120 deg. C) to prevent damage to the ceramic. As the sintered ceramic comes into contact with the metal brush, the metal brush is electrically charged by a power supply, and the bottom facing exterior electrode 78 on the sintered ceramic is electrically conducted to the (grounded) surface, and the brush electrically conducts to the upward facing exterior electrode 76 of the sintered ceramic. The high voltage charge of the metal brush (e.g. 12 to 15 Kilovolts/cm) polarizes 116 the ceramic layers 70 and 72 of the sintered ceramic transformer 2. To prevent arcing as the electrode 76 comes into close proximity with the metal brush, the power supply is only turned on after the electrode 76 establishes contact with the metal brush. This method of polarizing 116 produces two ceramic layers 70 and 72 polarized 116 in the same direction (i.e., 70 +/−, 72 +/−). It may be desirable to polarize the ceramic layers 70 and 72 in different directions with respect to each other (i.e., 70 +/−, 72 −/+). For polarizing 116 in this manner, the center electrode 74 is grounded and metal brushes contact the outer electrodes 76 and 78.

A piezoelectric transformer 2 constructed in accordance with the preceding description comprises a pair of piezoelectric ceramic wafers 70 and 72 which are intimately bonded to each other along one of each of their major faces by an internal electrode 74 formed by the metallization layer 74. Electric terminals 80, 82 and 84 are connected (e.g. by wire and solder, or other common means) to an exposed surface of the electrodes 76, 78 and 74 respectively.

Figure 4:
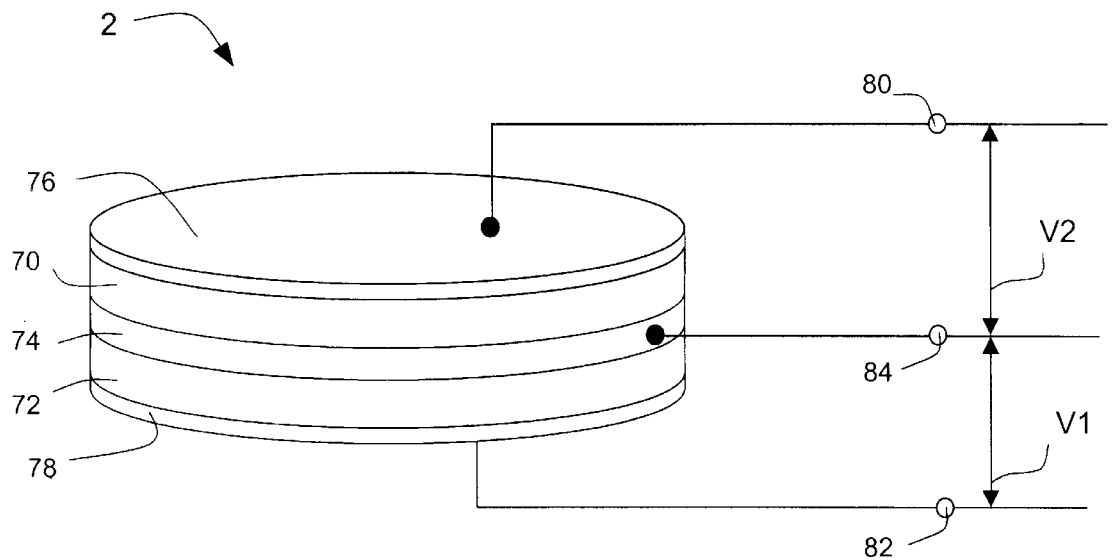
FIG. 4 is a perspective view showing a piezoelectric transformer constructed in accordance with the preferred embodiment of the present invention.

Referring to FIG. 4: When a primary (i.e. input) voltage V1 is applied across terminals 82 and 84 connected to the electrodes 78 and 74 of the first ceramic wafer 72, the first ceramic wafer 72 will piezoelectrically generate an extensional stress commensurate with the magnitude of the input voltage V1, the piezoelectric properties of the wafer 72 material, the size and geometry of the wafer 72 material, and the elasticity of the electrodes 78 and 74 which are bonded to the first wafer 72. The extensional stress which is generated by the input voltage V1 causes the first ceramic wafer 72 to be radially strained.

Because the first ceramic wafer 72 is securely bonded to the second ceramic wafer 70 (i.e., by internal electrode 74), any radial strain (and bending) of the first ceramic wafer 72 will result in a radial strain (of the same magnitude and direction) in the second ceramic wafer 70. The radial strain (and bending) of the second piezoelectric ceramic wafer 70 generates a voltage potential V2 across the two electrodes 74 and 76 of the second ceramic wafer 70. The electric terminals 84 and 80 may be electrically connected to corresponding electrodes 74 and 76 of the second ceramic wafer 70. The magnitude of the piezoelectrically generated voltage V2 between the two electrodes 74 and 76 of the second ceramic wafer 70 depends upon the piezoelectric properties of the wafer 70 material, the size, geometry and poling of the wafer 70 material.

Thus, by applying a first voltage V1 across the electrodes 78 and 74 of the first ceramic wafer 72, the first ceramic wafer 72 is caused to radially strain, which, in turn, causes the second ceramic wafer 70 to radially strain a like amount, which, in turn produces a second voltage potential V2 between the electrodes 74 and 76 of the second ceramic wafer 70.

The ratio of the first voltage V1 to the second voltage V2 is a function of the piezoelectric properties of the wafer 70 and 72, the size and geometry of the wafers 70 and 72 material, the elasticity of the other materials of the other laminate layers (i.e., internal electrode 74 and external electrodes 76 and 78) and the poling characteristics of the two ceramic wafers 70 and 72.

As shown in FIG. 4, in the preferred embodiment of the invention, in the piezoelectric transformer 2, the facing surfaces of the first ceramic wafer 72 and second ceramic wafer 70, respectively, are electrically connected to a common electric terminal 84 connected to the metallization 74 layer.

Figure 5:
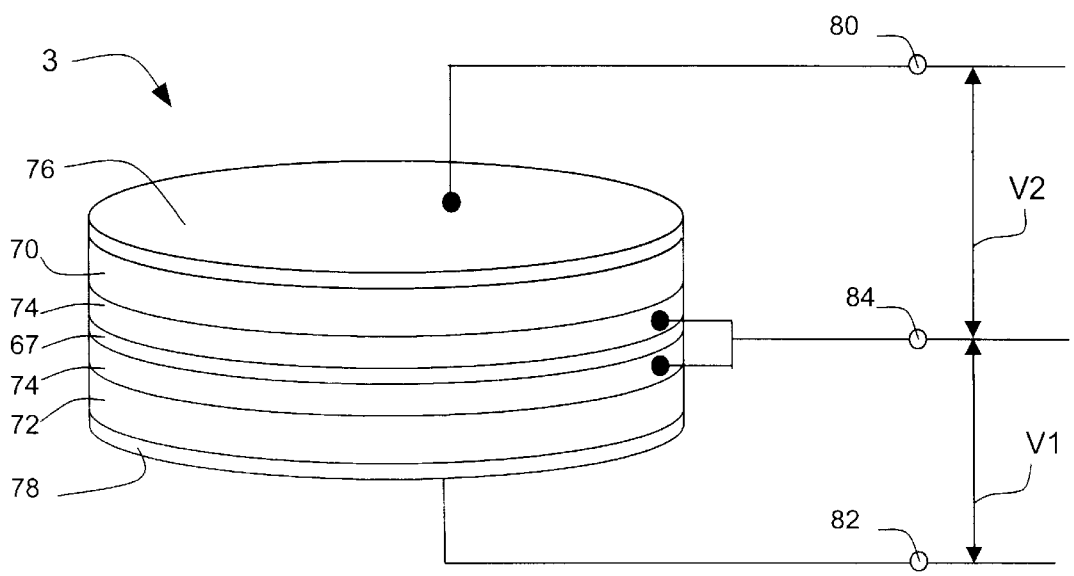
FIG. 5 is a perspective view of a modified embodiment of the invention.

Referring now to FIG. 5: In an alternative embodiment of the transformer 3, the corresponding facing metallized 74 surfaces of two ceramic wafers 70 and 72 are electrically insulated from each other, (for example by a dielectric layer 67 such as another ceramic), and connected to corresponding terminals. In this embodiment of a piezoelectric transformer 3, the facing surfaces of the first ceramic wafer 72 and second ceramic wafer 70, respectively, each have an internal electrode 74 (which are separated by the dielectric layer 67). Each internal electrode 74 is electrically connected to a common electric terminal 84 at the exposed surface of the internal electrode 74. A piezoelectric transformer 3 constructed in accordance with this modification of the invention may be used in an electric circuit to electrically protect electrical components "downstream" from the transformer 3 from damage from high current discontinuities "upstream" of the transformer 3.

Figure 6:
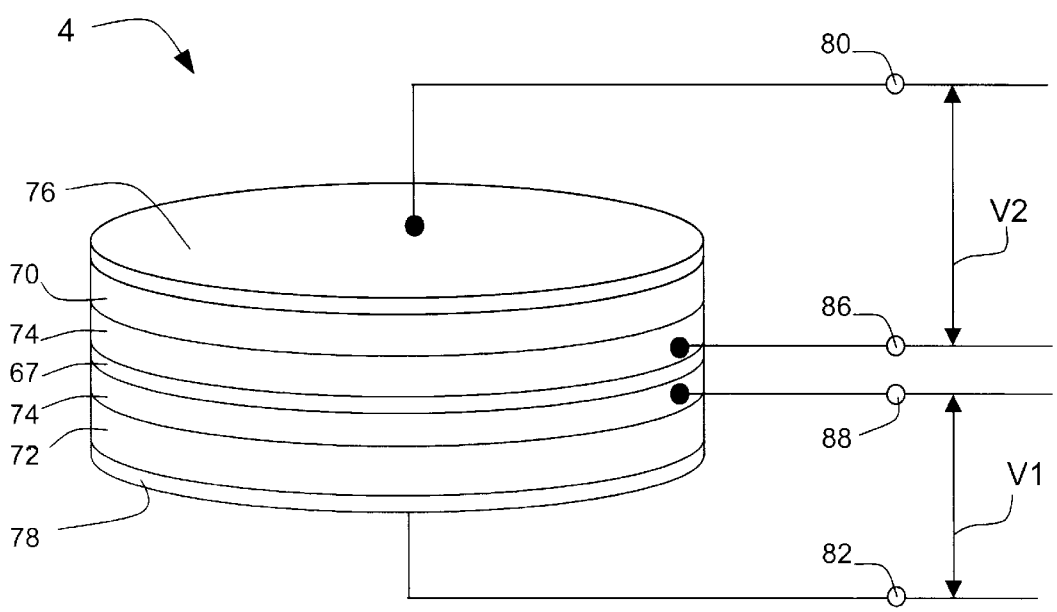
FIG. 6 is a perspective view of a modified embodiment of the invention.

Referring now to FIG. 6: In an alternative embodiment of the transformer 4, the corresponding facing metallized 74 surfaces of two ceramic wafers 70 and 72 are electrically insulated from each other, (for example by a dielectric layer 67), and connected to different corresponding terminals. In this embodiment of a piezoelectric transformer 4, the facing surfaces of the first ceramic wafer 72 and second ceramic wafer 70, respectively, each have an internal electrode 74 (which are separated by the dielectric layer 67). Each internal electrode 74 is electrically connected to a separate electric terminal 86 and 88 at the exposed surface of the internal electrode 74. In this embodiment of the transformer 4, the two piezoelectric ceramic wafers 70 and 72 are completely electrically isolated from each other. A transformer 4 constructed in accordance with this modification of the invention may be used in an electric circuit to electrically protect electrical components "downstream" from the transformer 4 from damage from high current discontinuities "upstream" of the transformer 4.

While the above description contains many specificities, these should not be construed as limitations on the scope of the invention, but rather as an exemplification of one preferred embodiment thereof. Many other variations are possible, for example:

- The two ceramic wafers 70 and 72 may be constructed of either similar or dissimilar piezoelectric materials which may either have identical or dissimilar piezoelectric coefficients;
- The two ceramic wafers 70 and 72 may either be of equal or unequal thicknesses;
- The ceramic wafers need not be disk shaped but may also be of a rectangular or other shape;
- The ceramic wafers need not be flat but may be curved or dome shaped;
- There may be more than two ceramic wafers;
- Metallization may be used on more than one face of a ceramic wafer and can be used for both internal and external electrodes;
- Metallization may be applied on only one or both facing surfaces of ceramic wafers;
- Electrical connections need not be made solely on the exposed surface of the internal electrode but may be connected with through holes or vias;
- External electrodes may by applied by any metal deposition technique including using an adhesive to attach one or both external electrodes;
- The green ceramic wafers may be formed by any technique for making green shapes including doctor blading, extrusion, injection molding, casting, pressing, hot pressing or the like;
- Sintering/cofiring may be conducted in an oven, a crucible, on a plate, in an autoclave, by conductive heating in a hot press or the like manner of heating;
- Sintering/cofiring may be conducted in a reducing, oxidizing or neutral atmosphere depending on the desired reaction of the atmosphere with the ceramic or the metallization material;
- Sintering/cofiring need not be conducted in a vacuum, or at a atmospheric pressure, but may be conducted at any pressure;
- Binder burn-off and sintering the ceramic/metallization may be conducted in different atmospheres, at different pressures and by different heating mechanisms;

Accordingly, the scope of the invention should be determined not by the embodiment illustrated, but by the appended claims and their legal equivalents.

What is claimed is:

1. A method for manufacturing a piezoelectric transformer comprising the steps of:
   - obtaining a first sinterable non-oxide ceramic composition;
   - obtaining a second sinterable non-oxide ceramic composition;
   - mixing said first sinterable non-oxide ceramic composition with a first organic binder to form a first ceramic mixture;
   - mixing said second sinterable non-oxide ceramic composition with a second organic binder to form a second ceramic mixture;
   - forming a first green shape from said first ceramic mixture, said first green shape having two opposing major faces;
   - forming a second green shape from said second ceramic mixture, said second green shape having two opposing major faces;
   - applying a metallization material to at least one major face of each of said first and second green shapes, said metallization material comprising a third binder and a refractory metal;
   - pressing a metallized major face of said first green shape against a major face of said second green shape to form a green composite structure;
   - placing said green composite structure in a first atmosphere;
     - said first atmosphere being oxidizing to said first, second and third binders;
     - said first atmosphere being non-oxidizing to said refractory metal;
   - raising a temperature of said green composite structure to a temperature wherein said first, second and third binders thermally decompose;
   - raising a temperature of said green composite structure to a sintering temperature;
   - maintaining said sintering temperature until said green composite structure forms a sintered ceramic having two opposing major faces and a rare earth metal electrode;
   - lowering a temperature of said sintered ceramic from said sintering temperature to room temperature;
   - applying electrodes to said two opposing major faces of said sintered ceramic; and
   - polarizing said sintered ceramic to form a piezoelectric transformer.

2. The method for manufacturing a piezoelectric transformer of claim 1, further comprising the step of:
   - before raising a temperature of said green composite structure to a sintering temperature, placing said green composite structure in a second atmosphere; said second atmosphere being a non-oxidizing atmosphere.

3. The method for manufacturing a piezoelectric transformer of claim 2, wherein said refractory metal is chosen from the group consisting of: Tungsten, Molybdenum, Columbium and Tantalum.

4. The method for manufacturing a piezoelectric transformer of claim 3, wherein said first atmosphere consists of Hydrogen and water vapor.

5. The method for manufacturing a piezoelectric transformer of claim 4, further comprising:
   - providing a dielectric layer having first and second opposing major faces;
   - and wherein said step of a pressing a metallized major face of said first green shape against a major face of said second green shape comprises pressing a metallized major face of said first green shape against said first major face of said dielectric layer and pressing a metallized major face of said second green shape against said second major face of said dielectric layer to form a green composite structure.

6. A method for manufacturing a piezoelectric transformer comprising the steps of:
   - obtaining a first sinterable ceramic oxide composition;

obtaining a second sinterable ceramic oxide composition;

mixing said first sinterable ceramic oxide composition with a first organic binder to form a first ceramic mixture;

mixing said second sinterable ceramic oxide composition with a second organic binder to form a second ceramic mixture;

forming a first green shape from said first ceramic mixture, said first green shape having two opposing major faces;

forming a second green shape from said second ceramic mixture, said second green shape having two opposing major faces;

applying a metallization material to at least one major face of each of said first and second green shapes, said metallization material comprising a third binder and a metal having a conductive oxide;

pressing a metallized major face of said first green shape against a major face of said second green shape to form a green composite structure;

placing said green composite structure in an oxidizing atmosphere;

raising a temperature of said green composite structure to a temperature wherein said first second and third binders thermally decompose;

raising a temperature of said green composite structure to a sintering temperature;

maintaining said sintering temperature until said green composite structure forms a sintered ceramic having two opposing major faces and a conductive metal oxide electrode;

lowering a temperature of said sintered ceramic from said sintering temperature to room temperature;

applying electrodes to said two opposing major faces of said sintered ceramic; and polarizing said sintered ceramic to form a piezoelectric transformer.

7. The method for manufacturing a piezoelectric transformer of claim 6, wherein said metal having a conductive oxide is chosen from the group consisting of: Ruthenium, Rhodium, Iridium, Osmium, Indium, Tin and mixtures thereof.

8. The method for manufacturing a piezoelectric transformer of claim 7, further comprising:

providing a dielectric layer having first and second opposing major faces;

and wherein said step of a pressing a metallized major face of said first green shape against a major face of said second green shape comprises pressing a metallized major face of said first green shape against said first major face of said dielectric layer and pressing a metallized major face of said second green shape against said second major face of said dielectric layer to form a green composite structure.

* * * * *